United States Patent
Kim et al.

(10) Patent No.: US 8,115,548 B2
(45) Date of Patent: Feb. 14, 2012

(54) APPARATUS AND METHOD FOR CONTROLLING DISTORTIONS OF AMPLIFIER

(75) Inventors: Jung-ho Kim, Yongin-si (KR); Sang-chul Ko, Seoul (KR); Young-tae Kim, Seongnam-si (KR); Jung-woo Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 123 days.

(21) Appl. No.: 12/483,298

(22) Filed: Jun. 12, 2009

(65) Prior Publication Data
US 2010/0123519 A1    May 20, 2010

(30) Foreign Application Priority Data
Nov. 14, 2008    (KR) .................. 10-2008-0113317

(51) Int. Cl.
H03F 1/26    (2006.01)
(52) U.S. Cl. .................. 330/149; 330/297; 330/10
(58) Field of Classification Search .................. 330/149, 330/297, 10
See application file for complete search history.

(56) References Cited

U.S. PATENT DOCUMENTS

| | | | | |
|---|---|---|---|---|
| 6,414,614 | B1 * | 7/2002 | Melanson | 341/143 |
| 7,728,658 | B2 * | 6/2010 | Andersen et al. | 330/10 |
| 7,756,592 | B2 * | 7/2010 | Craven | 700/30 |
| 7,852,150 | B1 * | 12/2010 | Arknaes-Pedersen | 330/10 |

FOREIGN PATENT DOCUMENTS

| | | |
|---|---|---|
| JP | 2002-223132 | 8/2002 |
| KR | 10-2003-0024693 | 3/2003 |
| KR | 10-2003-0047473 | 6/2003 |
| KR | 10-2005-0060307 | 6/2005 |
| KR | 10-2007-0074952 | 7/2007 |

* cited by examiner

*Primary Examiner* — Patricia Nguyen
(74) *Attorney, Agent, or Firm* — NSIP Law

(57) ABSTRACT

Disclosed are an apparatus and method for controlling output distortions of an amplifier. The apparatus for controlling output distortions of an amplifier, includes a compensation signal generator to predict a fluctuation of a supply voltage of a power supply using a prediction model which reflects fluctuations characteristics of the supply voltage, and to generate a compensation signal based on the prediction, and a compensator to transform an input signal using the compensating signal to control the output distortions.

19 Claims, 6 Drawing Sheets

APPARATUS AND METHOD FOR CONTROLLING DISTORTIONS OF AMPLIFIER

CROSS-REFERENCE TO RELATED APPLICATION(S)

This application claims the benefit under 35 U.S.C. §119(a) of a Korean Patent Application No. 10-2008-0113317, filed on Nov. 14, 2008, the disclosure of which is incorporated herein by reference in its entirety for all purposes.

BACKGROUND

1. Field

The following description relates to a method and apparatus for controlling distortions of an amplifier.

2. Description of the Related Art

An amplifier may be used to modulate and amplify input signals. In an output terminal of an amplifier, for example, a digital amplifier, generally, active elements such as transistors are formed in a bridge structure. Accordingly, in order to normally operate the amplifier, constant external power may need to be supplied to the output terminal.

However, if a supply voltage to be applied to the output terminal is cut off intermittently or fluctuates, the output signal of the amplifier may be distorted. In the case of a digital amplifier which processes audio signals, such supply voltage fluctuations may cause deterioration of the sound quality.

A number of solutions have been proposed. One method is to adopt a power supply with a sufficient capacity to provide the constant supply voltage to an output terminal of an amplifier. However, this method may not be practical due to the manufacturing cost of providing such a power supply.

Another method proposed is to compensate for supply voltage fluctuations by controlling changes in characteristics caused by the supply voltage fluctuations. An example is a feedback scheme to compensate the differences between output signals and ideal signals of the supply voltage. However, since such a feedback control scheme uses error signals generated in a previous operation, controlling the changes in real-time may be difficult. Furthermore, in such a method, a solution may not be available for supply voltage fluctuations occurring in transitional periods such as the start and end of a control operation.

SUMMARY

In one general aspect, there is provided an apparatus and method for controlling output distortions of an amplifier by predicting supply voltage fluctuations and a degree of output distortions resulting from the predicted supply voltage fluctuations, and transforming input signals in advance so as to prevent or cancel the predicted output distortions.

In another general aspect, there is provided an apparatus for controlling output distortions of an amplifier, the apparatus including a compensation signal generator to predict a fluctuation of a supply voltage of a power supply using a prediction model which reflects fluctuations characteristics of the supply voltage, and to generate a compensation signal based on the prediction, and a compensator to transform an input signal using the compensating signal to control the output distortions.

The compensation signal generator may generate the compensation signal in consideration of a degree of the output distortions to be caused by the fluctuation of the supply voltage.

The compensation signal generator may include a prediction model storage to store the prediction model, a monitoring unit to detect an initial fluctuation of the supply voltage, and a signal generator to generate the compensation signal based on the prediction model in response to the initial fluctuation being detected.

The compensator may transform the input signal by adding or synthesizing the input signal with the compensation signal.

The compensator may check validity of the compensation by receiving an output signal of the amplifier.

The input signal may be an audio signal.

The compensator may transform the input signal before the input signal is amplified or modulated by the amplifier.

In still another general aspect, there is provided an apparatus for controlling output distortions of an amplifier, the apparatus including a power estimator to estimate consumption power from frame data of a digital audio signal, a compensation signal generator to generate a compensation signal using the estimated consumption power or a prediction model reflecting fluctuations characteristics of a supply voltage of a power supply, and a compensator to transform the digital audio signal using the compensation signal to control the output distortions.

The consumption power may be power of the power supply used to process the digital audio signal.

The compensation signal generator may generate the compensation signal in consideration of the consumption power or a degree of output distortions to be caused by fluctuations of the supply voltage.

The compensation signal generator may include a prediction model storage to store the prediction model, a monitoring unit to detect an initial fluctuation of the supply voltage or determine whether the estimated consumption power exceeds a threshold value, and a signal generator to generate the compensation signal with reference to the estimated consumption power or the prediction model in response to the estimated consumption power exceeding the threshold value or in response to the initial fluctuation being detected.

The compensator may transform the input signal by adding or synthesizing the input signal with the compensation signal.

The compensator may check validity of the compensation by receiving an output signal of the amplifier.

The compensator may transform the input signal before the input signal is amplified or modulated by the amplifier.

In yet another general aspect, there is provided a method of controlling output distortions of an amplifier, the method including monitoring a supply voltage of a power supply to determine whether a fluctuation occurs in the supply voltage, generating a compensation signal using a prediction model which reflects fluctuations characteristics of the supply voltage in response to a fluctuation occurring in the supply voltage, and transforming an input signal using the compensation signal to control the output distortions.

The method may further include checking validity of the compensation by receiving an output signal of the amplifier.

In still yet another general aspect, there is provided a method of controlling output distortions of an amplifier, the method including estimating consumption power from frame data of a digital audio signal, generating a compensation signal using the estimated consumption power or a prediction model reflecting fluctuations characteristics of a supply voltage of a power supply, and transforming the digital audio signal using the compensation signal to control the output distortions.

The method may further include checking validity of the compensation by receiving an output signal of the amplifier.

Other features and aspects will be apparent from the following detailed description, the drawings, and the claims.

Figure 1:
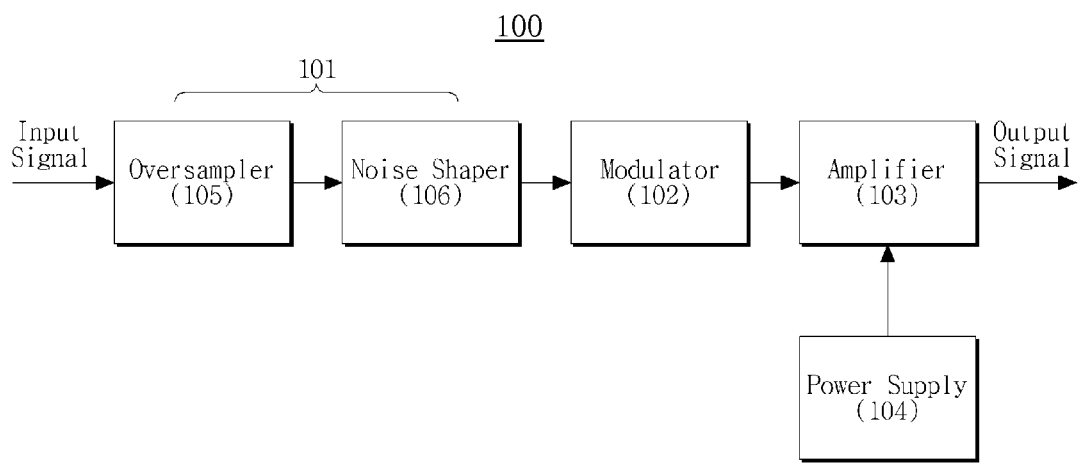
FIG. 1 is a block diagram illustrating an exemplary amplifier apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

FIG. 1 illustrates an exemplary amplifier apparatus 100 to which a control apparatus described below can be applied. The amplifier apparatus 100 may be a digital amplifier.

Referring to FIG. 1, the amplifier apparatus 100 includes a preprocessor 101, a modulator 102, an amplifier 103, and a power supply 104. For example, the amplifier apparatus 100 may receive audio signals and perform various signal processings, such as modulation and amplification, on the audio signals.

Assuming the amplifier apparatus 100 processes audio signals, the preprocessor 101 may include elements capable of performing preprocessing to improve sound-quality. For example, the preprocessor 101 may include an oversampler 105, and a noise shaper 106. A signal that passes through the preprocessor 101 is output as, for example, a pulse code modulation (PCM) signal and the PCM signal is modulated to, for example, a pulse width modulation (PWM) signal by the modulator 102. The amplifier 103 receives the PWM signal, and amplifies the PWM signal using a supply voltage supplied from the power supply 104.

The amplifier 103, which is an output terminal, may perform the amplification by driving a switch device such as FET at high speed. For the amplification, an external supply voltage is used as a driving voltage, and the power supply 104 supplies the external supply voltage to the amplifier 103. However, if the external supply voltage fluctuates, the amplitude of the resultant amplified signal may not be in proportion to the PWM signal obtained in the previous stage, which leads to deterioration in sound quality.

In other words, the quality of signals amplified by the amplifier apparatus 100 may depend directly on supply voltage fluctuations of the power supply 104. Accordingly, a control apparatus is provided which predicts voltage fluctuations of the power supply 104 and transforms input signals in advance in correspondence to the predicted voltage fluctuations, so as to prevent output distortions from being produced. Such a control apparatus may be implemented as software in a control module of the amplifier 100 or may be implemented as a separate signal processing chip.

Figure 2:
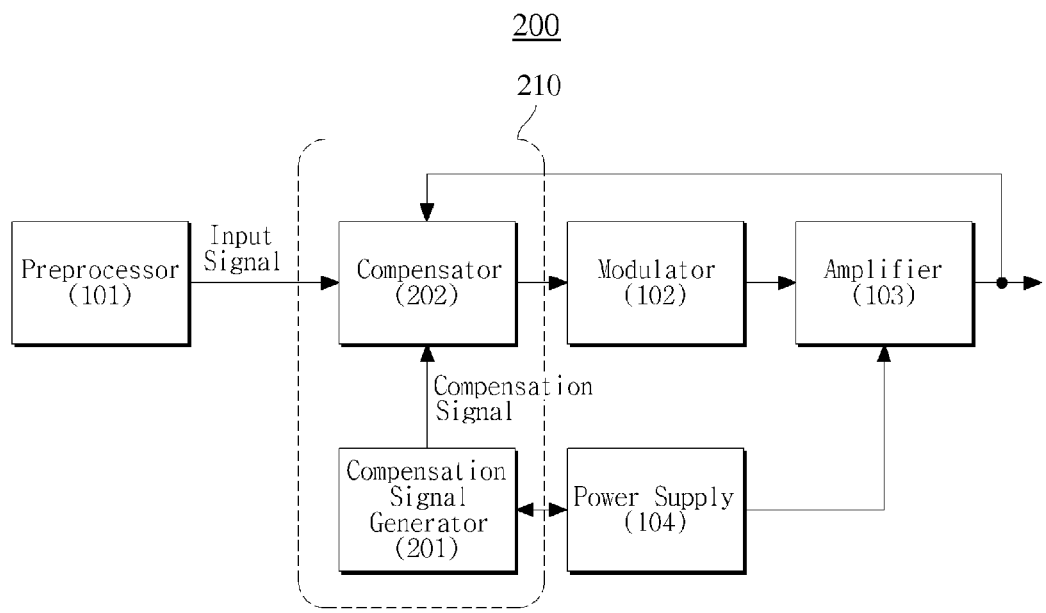
FIG. 2 is a block diagram illustrating an exemplary output distortion control apparatus.

FIG. 2 illustrates an amplifier apparatus 200 having an exemplary output distortion control apparatus 210. The amplifier apparatus 200 may be a digital amplifier.

Referring to FIG. 2, a preprocessor 101, a modulator 102, an amplifier 103, and a power supply 104 may operate in the same manner as the corresponding elements described above with reference to FIG. 1, and accordingly further descriptions thereof will be omitted for conciseness. The output distortion control apparatus 210 includes a compensation signal generator 201 and a compensator 202.

The compensation signal generator 201 predicts supply voltage fluctuations of the power supply 104 and generates a compensation signal in correspondence to the predicted voltage fluctuations. The compensation signal may be a signal that is to be synthesized or added with an input signal in order to cancel distortions that may occur in an output signal due to the supply voltage fluctuations of the power supply 104.

The compensation signal generator 201 may predict the supply voltage fluctuations of the power supply 104, based on a prediction model which reflects the supply voltage fluctuation characteristics of the power supply 104.

The prediction model may be modeling data which represents how supply voltage fluctuations of the power supply 104 occurring at an arbitrary time t will change at the following time t+1. Generally, since a degree of output distortions due to supply voltage fluctuations is in proportion to the amount of the supply voltage fluctuations, predicting future supply voltage fluctuations enables predicting a degree of the corresponding distortions. Accordingly, when a supply voltage fluctuation of the power supply 104 is initially detected, the compensation signal generator 201 may predict a future fluctuation and generate a compensation signal to transform input signals in advance in consideration of a change in the output of the amplifier 103 that will likely to occur due to the future fluctuation.

The compensator 202 receives an input signal (for example, a signal which passed through the preprocessor 101) and the compensation signal generated by the compensation signal generator 201, and transforms the input signal using the compensation signal. The transformation of the input signal may be performed in such a manner as to cancel output distortions due to the supply voltage fluctuations of the power supply 104. For example, the transformation may be performed in a manner to add or synthesize the input signal with the generated compensation signal. Also, the compensator 202 may check validity of the compensation by receiving the output signal of the amplifier 103. The validity check may be carried out in a manner to display an output signal recognizable by a user or to create a system error report where distortions exceeding a predetermined error limit occur. The signal transmitted from the amplifier 103 to the compensator 202 to check the validity of compensation may be distinguished from a control signal for a feed-back control.

Since future fluctuations may be predicted and compensated depending upon fluctuations of the supply voltage, controlling output distortions, and response characteristics in transitional periods such as the start and end of a control operation may be improved. An exemplary method for obtaining a prediction model by which the compensation signal generator 201 predicts the output fluctuations of the power supply 104 will be described with reference to FIG. 3.

Figure 3:
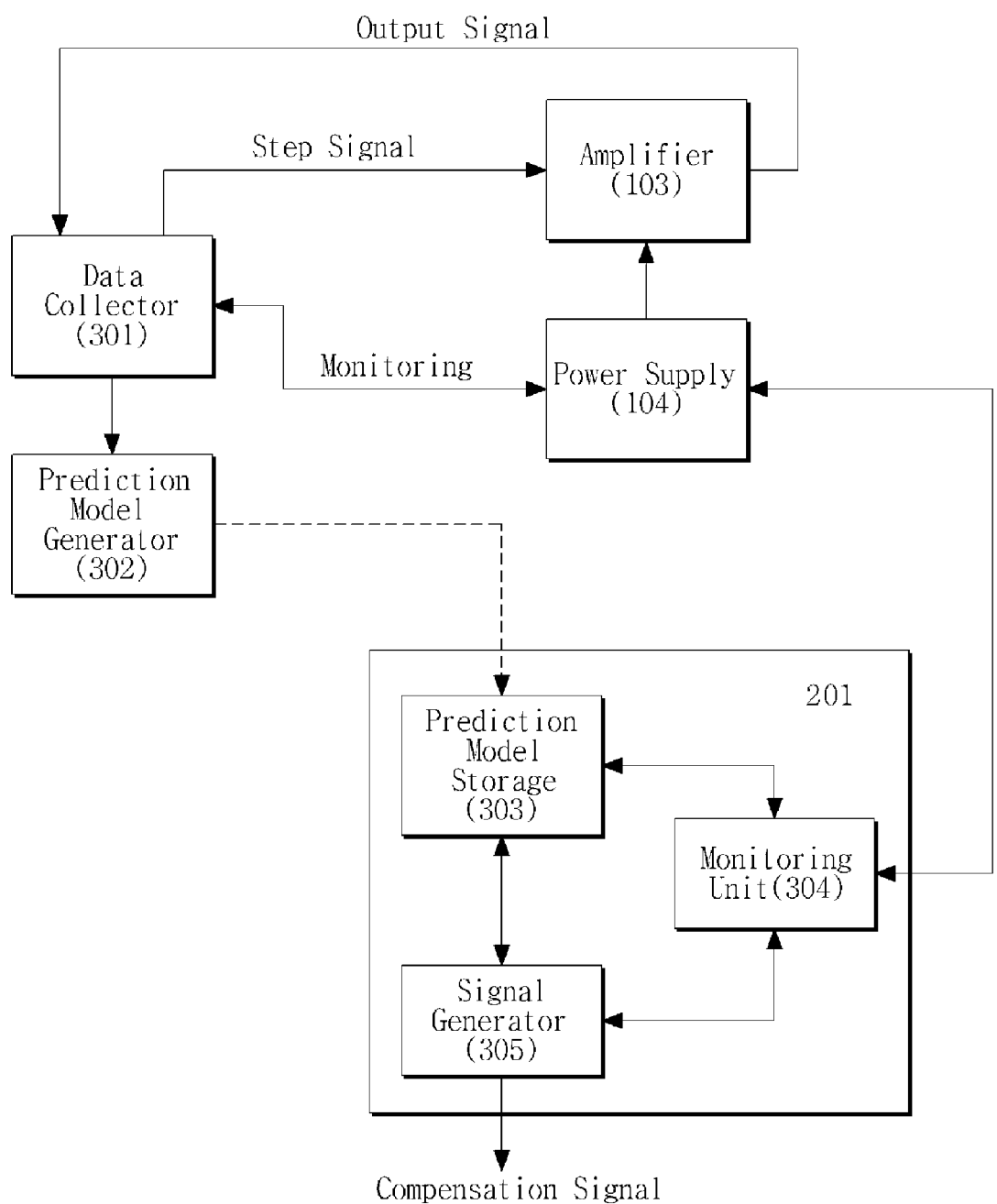
FIG. 3 is a block diagram illustrating an exemplary configuration for prediction modeling.

FIG. 3 illustrates a configuration for explaining a method for obtaining a prediction model to predict output fluctuations of a power supply.

Referring to FIG. 3, a data collector 301 monitors an amplifier 103 and a power supply 104 and collects predetermined data from the amplifier 103 and power supply 104. For example, the data collector 301 transfers a predetermined signal to the amplifier 103, and receives the amplified waveform corresponding to the predetermined signal from the amplifier 103 and receives the waveform of a supply voltage from the power supply 104.

Figure 8:
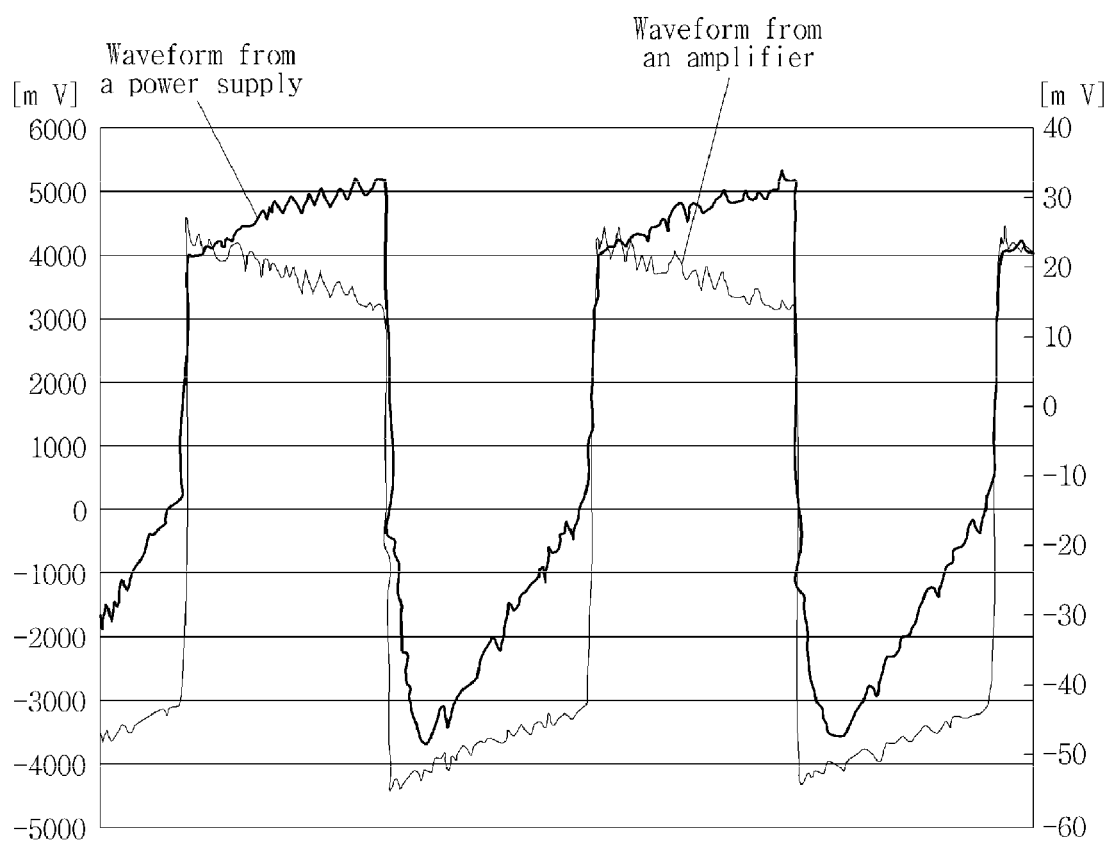
FIG. 8 is a graph illustrating an example of data collected by the configuration illustrated in FIG. 3.

An example of data collected in this way is shown in FIG. 8. FIG. 8 illustrates a graph showing fluctuations or transitions characteristics for a supply voltage and an output signal. In FIG. 8, a darker line represents a waveform from a power supply, and a light line represents a waveform from an amplifier. The number of y-axis on the right side denotes an output voltage of a power supply and the number of y-axis on the left side denotes an output voltage of an amplifier.

Referring back to FIG. 3, a prediction model generator 302 obtains a prediction model using the collected data from the data collector 301. The prediction model may be system modeling data about the behavior or fluctuations characteristics of the power supply 104.

A state-space model used by the prediction model generator 302 to create a prediction model may be expressed as Equation 1, below.

$$x(t+1)=Ax(t)+Bu(t)+Ke(t) \quad y(t)=Cx(t)+Du(t)+e(t) \quad (1)$$

In Equation 1, x(t) represents a supply voltage of the power supply 104 at a current time, x(t+1) represents a supply voltage of the power supply 104 at a future time, u(t) represents a primary differential value of x(t), e(t) represents an error value, and A, B, C and D represent weights. Also, y(t) may be another variable (for example, power) which represents the characteristics of the power supply 104. Here, it is assumed that x is a voltage and y is power, however x and y may be any other characteristic values of the power supply 104. Also, the Equation 1 is given as an exemplary method to generate a prediction model. Accordingly, other known or to be known techniques may be used, such as an autoregressive model, Box-jenkins model and Predictive Error model.

The prediction model generated by the prediction model generator 302 may be transmitted or stored to a prediction model storage 303 included in the compensation signal generator 201. A monitoring unit 304 of the prediction signal generator 201 may monitor the supply voltage of the power supply 104, and in response to detecting a supply voltage fluctuation, cause a signal generator 305 to generate a compensation signal with reference to the prediction model. The compensation signal may be added to an input signal to transform the input signal, so as to cancel output distortions.

Figure 4:
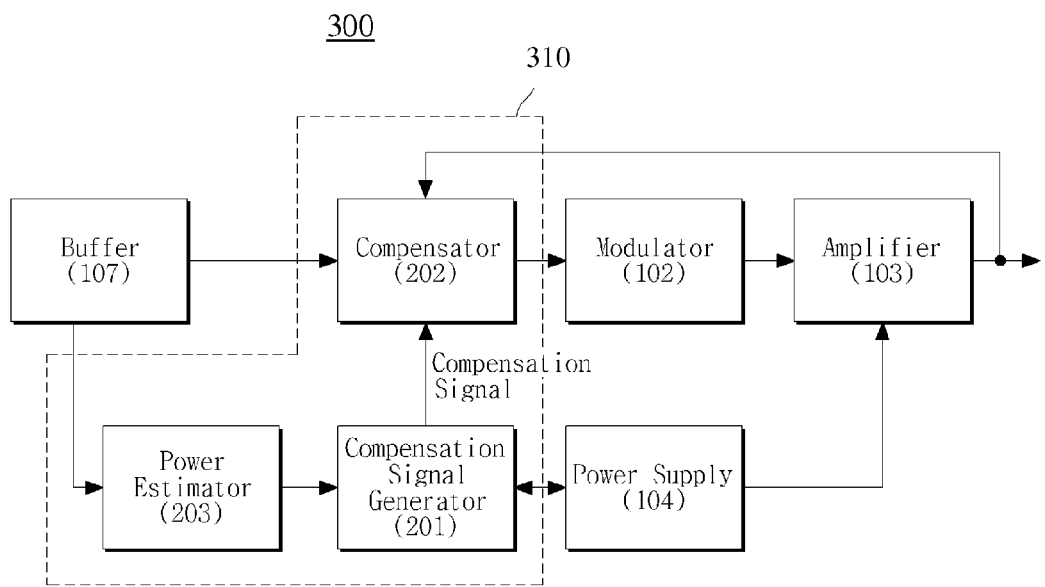
FIG. 4 is a block diagram illustrating another exemplary output distortion control apparatus.

FIG. 4 illustrates an amplifier apparatus 300 having an exemplary output distortion control apparatus 310. The amplifier apparatus 300 may be a digital amplifier.

Referring to FIG. 4, a preprocessor 101, a modulator 102, an amplifier 103, and a power supply 104 may operate in the same manner as the corresponding elements described above with reference to FIG. 1, and accordingly, further descriptions thereof will be omitted for conciseness. In this implementation, the amplifier apparatus 300 may receive and process frame-based digital audio signals, and accordingly, a buffer 107 may be provided in front of the amplifier apparatus 300.

The output distortion control apparatus 310 includes a compensation signal generator 201, a compensator 202, and a power estimator 203.

The power estimator 203 estimates consumption power using frame data of a digital audio signal. Here, the consumption power may be defined as consumption power of the amplifier 103 which is used to process a plurality of pieces of frame data for digital audio signals.

The compensation signal generator 201 generates a compensation signal using the consumption power estimated by the power estimator 203 and/or using a prediction model for a supply voltage of the power supply 104. The compensation signal may be used to transform input signals such that output distortions may be cancelled, which has been described above. For example, the compensation signal may be generated where consumption power estimated by the power estimator 203 exceeds a predetermined error limit and thus output distortions occur, and/or where output distortions occur due to supply voltage fluctuations of the power supply 104.

The compensator 202 receives an input signal and the compensation signal, and transforms the input signal based on the compensation signal in such a manner as to cancel the output distortions. For example, the compensator 202 may add or synthesize the input signal with the compensation signal.

Also, the compensator 202 may receive the output signal of the amplifier 103 and check validity of the compensation based on the output signal.

An exemplary method in which the power estimator 203 estimates the consumption power will be further described below.

Figure 5:
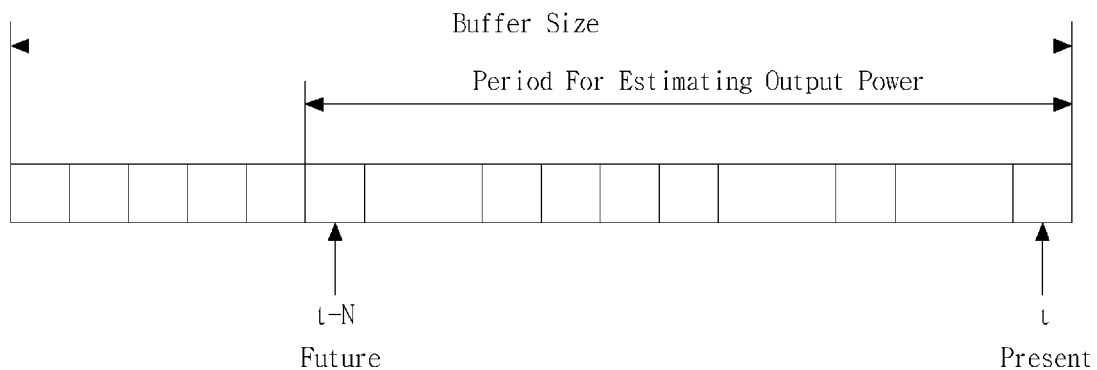
FIG. 5 is a diagram illustrating an exemplary frame data.

FIG. 5 illustrates exemplary frame data. That is, FIG. 5 illustrates an example of audio signal frames to describe a method of estimating consumption power.

If an amplifier apparatus receives audio signal frames, a plurality of pieces of frame data may be stored in the buffer 107 (see FIG. 4) or preprocessor 101 (see FIG. 2) which is an input terminal of the amplifier apparatus.

Referring to FIG. 5, if a current time is t and N pieces of data are provided, power which is used at a future time may be calculated by Equation 2, below.

$$P = \frac{1}{N}\sum_{n=1}^{N}\sqrt{S(i)^2} \quad (2)$$

In Equation 2, s(i) represents a signal received from the previous stage and P represents the calculated amount of power. The power estimation method may be carried out using various known or to be known weight functions and methods, and Equation 2 is one of such various weight functions. As an example, a moving average technique may be used.

Figure 6:
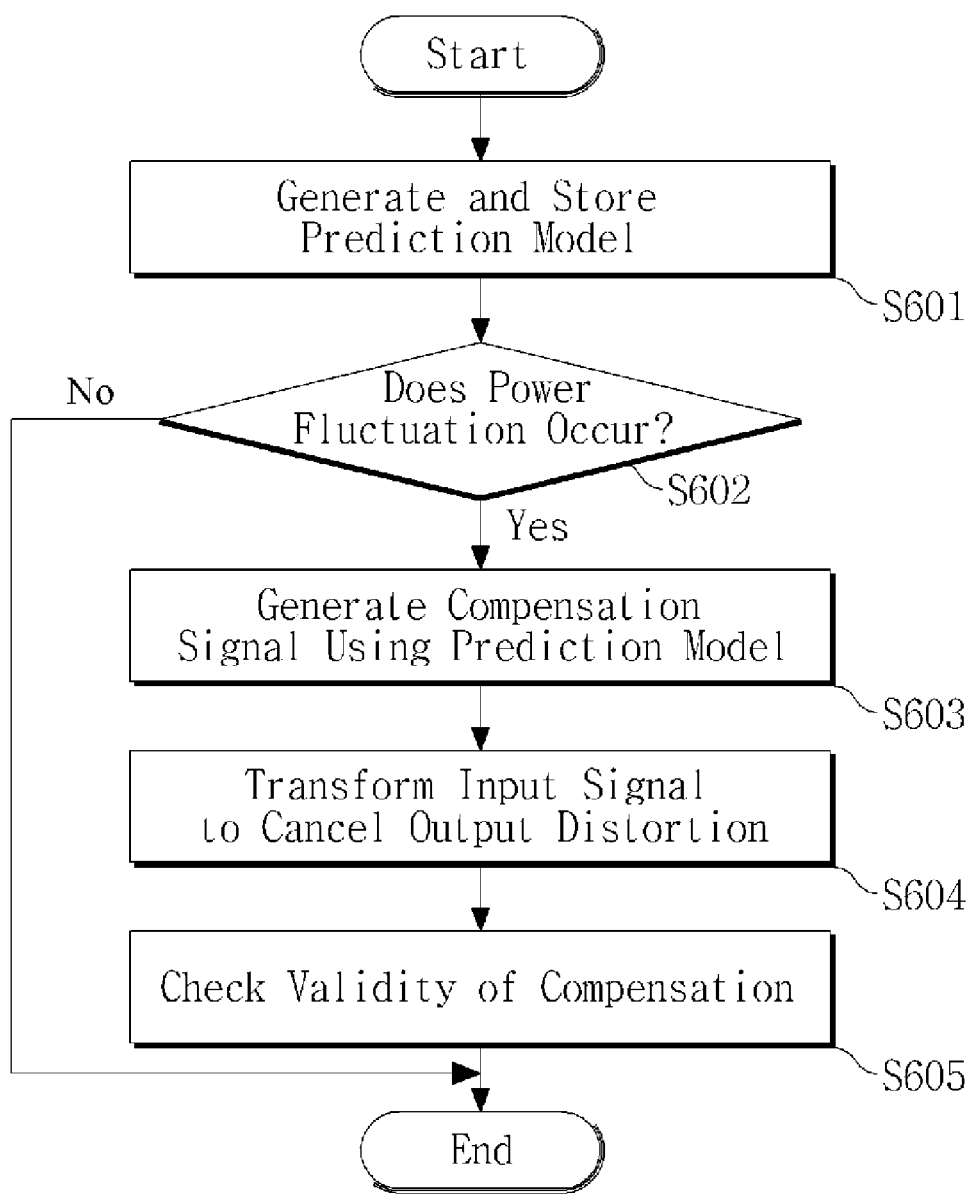
FIG. 6 is a flowchart illustrating an exemplary method for controlling output distortions.

FIG. 6 is a flowchart illustrating an exemplary method for controlling output distortions. The method may be carried out by, for example, an amplifier apparatus or an apparatus described with reference to FIGS. 1-4.

In operation S601, prior to a signal processing of an amplifier apparatus, a prediction model reflecting supply voltage fluctuations characteristics of a power supply may be generated and stored. For example, the configuration illustrated in FIG. 3 may be used to generate a prediction model of a supply voltage from the power supply.

Whether a fluctuation occurs in the supply voltage of the power supply is determined in operation S602. Here, the supply voltage fluctuation may be a change of a driving voltage or power which is supplied to an amplifier. For example, in response to a supply voltage which is supplied from the power supply to the amplifier exceeding a predetermined limit, it may be determined that a fluctuation occurs.

When a fluctuation initially occurs, a compensation signal is generated using the prediction model to cancel the predicted output distortions resulting from the fluctuation in operation S603. For example, the prediction model may enable predicting a supply voltage to be supplied at a future time using a supply voltage supplied at a current time. That is, a voltage or power at a specific time after initial detection of a fluctuation may be measured, a degree of output distortions corresponding to the measured voltage or power may be calculated, and a compensation signal to transform an input signal in advance to cancel the output distortions may be generated.

In operation S604, an input signal is transformed using the compensation signal generated in operation S603. For example, the input signal may be added or synthesized with the compensation signal to cancel the output distortions.

In operation S605, validity of the compensation may be checked by receiving the output signal of the amplifier. The validity check may be carried out in a manner to compare a signal not subjected to the compensation with a signal subjected to the compensation and display the result of the comparison to a user.

Figure 7:
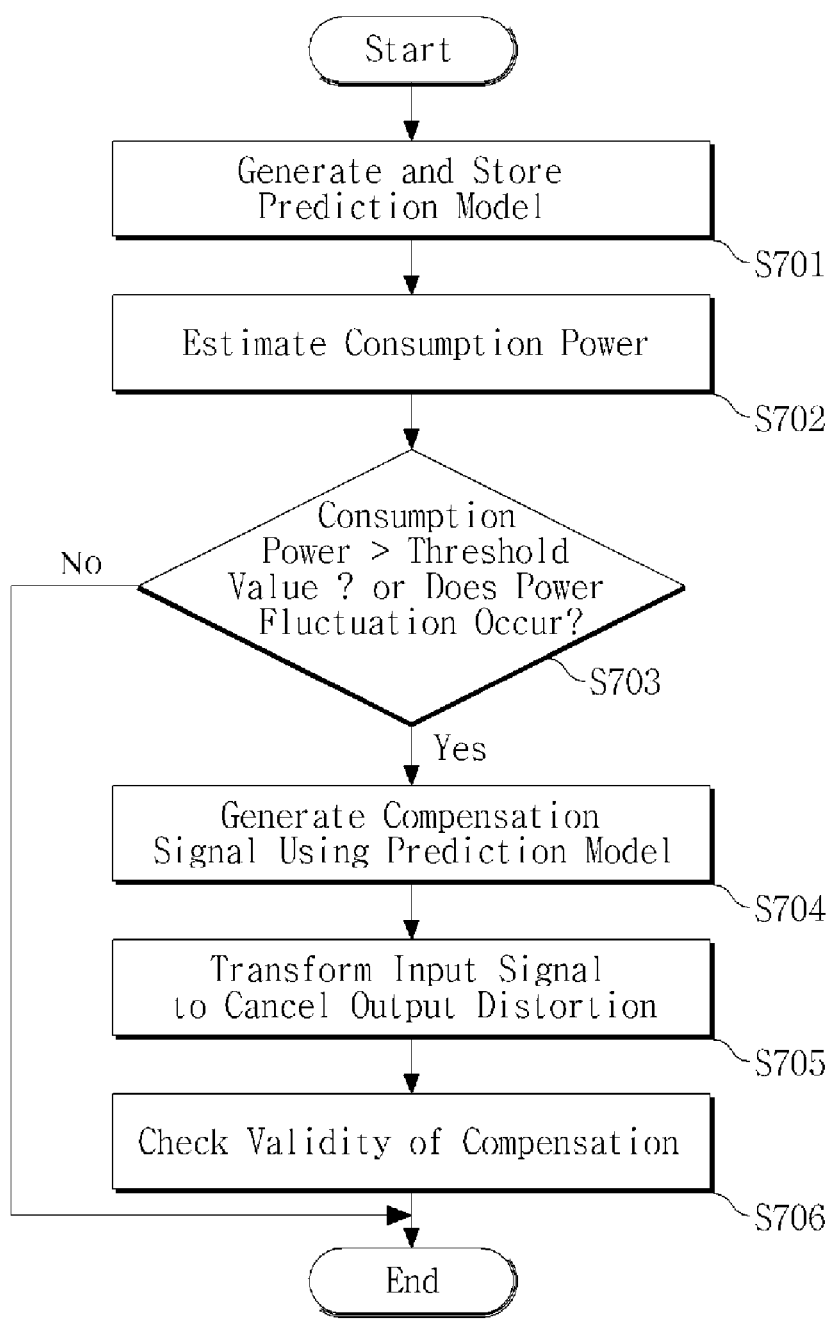
FIG. 7 is a flowchart illustrating another exemplary method for controlling output distortions.

FIG. 7 is a flowchart illustrating another method for controlling output distortions. For example, the method may be used in a case where signals input to an amplifier apparatus are digital audio signal frames. The amplifier apparatus may be a digital amplifier. The method may be carried out by, for example, an amplifier apparatus or an apparatus described with reference to FIGS. 1-4.

In operation S701, prior to a signal processing of an amplifier apparatus, a prediction model reflecting supply voltage fluctuations characteristics of a power supply may be generated and stored. For example, the configuration illustrated in FIG. 3 may be used to generate a prediction model of a supply voltage.

In operation S702, consumption power is estimated from frame data of digital audio signals. Here, the consumption power may be defined as consumption power of the amplifier (103 of FIG. 3) used to process a plurality of pieces of frame data for digital audio signals. As an example of a method of estimating the consumption power, the method described above with reference to FIG. 5 may be used.

Whether a fluctuation occurs in the supply voltage of the power supply or whether the estimated consumption power exceeds a predetermined limit is determined in operation S703. Here, the supply voltage fluctuation may be a change of a driving voltage or power which is supplied to the amplifier. For example, in response to a supply voltage which is supplied from the power supply to the amplifier exceeding a predetermined limit, it may be determined that a fluctuation occurs. Also, the predetermined limit may be a value of consumption power of the amplifier sufficient enough not to cause output distortion.

In operation S704, when a fluctuation initially occurs or consumption power exceeds the predetermined limit, a compensation signal for cancelling output distortions of the amplifier is generated using the consumption power estimated in operation S703 or using the prediction model obtained in operation 701.

In operation S705, an input signal is transformed using the compensation signal generated in operation S704. For example, the input signal may be added or synthesized with the compensation signal to cancel the output distortions.

In operation S706, validity of the compensation may be checked by receiving the output signal of the amplifier. The validity check may be carried out in a manner to compare a signal not subjected to the compensation with a signal subjected to the compensation and display the result of the comparison to a user.

The methods or operations described above may be recorded, stored, or fixed in one or more computer-readable media that includes program instructions to be implemented by a computer to cause a processor to execute or perform the program instructions. The media may also include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa.

It is understood that the terminology used herein, for example, cancel or cancelling, may be different in other applications or when described by another person of ordinary skill in the art, and may correspond to, for example, prevent or preventing, as the instances or results may be.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for controlling output distortions of an amplifier, the apparatus comprising:
    a compensation signal generator to predict a fluctuation of a supply voltage of a power supply using a prediction model which reflects fluctuations characteristics of the supply voltage, and to generate a compensation signal based on the prediction; and
    a compensator to transform an input signal using the compensation signal to control the output distortions before the input signal is amplified or modulated by the amplifier and before the input signal is combined with a signal that has been amplified or modified by the amplifier.

2. The apparatus of claim 1, wherein the compensation signal generator generates the compensation signal in consideration of a degree of the output distortions to be caused by the fluctuation of the supply voltage.

3. The apparatus of claim 1, wherein the compensation signal generator comprises:
    a prediction model storage to store the prediction model;
    a monitoring unit to detect an initial fluctuation of the supply voltage; and
    a signal generator to generate the compensation signal based on the prediction model in response to the initial fluctuation being detected.

4. The apparatus of claim 1, wherein the compensator transforms the input signal by adding or synthesizing the input signal with the compensation signal.

5. The apparatus of claim 1, wherein the compensator checks validity of the compensation by receiving an output signal of the amplifier.

6. The apparatus of claim 1, wherein the input signal is an audio signal.

7. An apparatus for controlling output distortions of an amplifier, the apparatus comprising
- a power estimator to estimate consumption power from frame data of a digital audio signal;
- a compensation signal generator to generate a compensation signal using the estimated consumption power or a prediction model reflecting fluctuations characteristics of a supply voltage of a power supply; and
- a compensator to transform the digital audio signal using the compensation signal to control the output distortions.

8. The apparatus of claim 7, wherein the consumption power is power of the power supply used to process the digital audio signal.

9. The apparatus of claim 7, wherein the compensation signal generator generates the compensation signal in consideration of the consumption power or a degree of output distortions to be caused by fluctuations of the supply voltage.

10. The apparatus of claim 7, wherein the compensation signal generator comprises:
- a prediction model storage to store the prediction model;
- a monitoring unit to detect an initial fluctuation of the supply voltage or determine whether the estimated consumption power exceeds a threshold value; and
- a signal generator to generate the compensation signal with reference to the estimated consumption power or the prediction model in response to the estimated consumption power exceeding the threshold value or in response to the initial fluctuation being detected.

11. The apparatus of claim 7, wherein the compensator transforms the input signal by adding or synthesizing the input signal with the compensation signal.

12. The apparatus of claim 7, wherein the compensator checks validity of the compensation by receiving an output signal of the amplifier.

13. The apparatus of claim 7, wherein the compensator transforms the input signal before the input signal is amplified or modulated by the amplifier.

14. A method of controlling output distortions of an amplifier, the method comprising:
- monitoring a supply voltage of a power supply to determine whether a fluctuation occurs in the supply voltage;
- generating a compensation signal using a prediction model which reflects fluctuations characteristics of the supply voltage in response to a fluctuation occurring in the supply voltage; and
- transforming an input signal using the compensation signal to control the output distortions before the input signal is amplified or modulated by the amplifier and before the input signal is combined with a signal that has been amplified or modified by the amplifier.

15. The method of claim 14, further comprising checking validity of the compensation by receiving an output signal of the amplifier.

16. A method of controlling output distortions of an amplifier, the method comprising:
- estimating consumption power from frame data of a digital audio signal;
- generating a compensation signal using the estimated consumption power or a prediction model reflecting fluctuations characteristics of a supply voltage of a power supply; and
- transforming the digital audio signal using the compensation signal to control the output distortions.

17. The method of claim 16, further comprising checking validity of the compensation by receiving an output, signal of the amplifier.

18. An apparatus for controlling output distortions of an amplifier, the apparatus comprising:
- a compensation signal generator to predict a fluctuation of a supply voltage of a power supply and to generate a compensation signal based on the prediction; and
- a compensator to transform an input signal using the compensation signal to control the output distortions before the input signal is amplified or modulated by the amplifier and before the input signal is combined with a signal that has been amplified or modified by the amplifier.

19. The apparatus of claim 18, further comprising a prediction model generator to generate the prediction model based on data collected from the power supply and data collected from the amplifier.

* * * * *